(12) United States Patent  
Van Aartrijk

(10) Patent No.: US 6,366,095 B1
(45) Date of Patent: Apr. 2, 2002

(54) METHOD AND DEVICE FOR DETECTING AND LOCATING IRREGULARITIES IN A DIELECTRIC

(75) Inventor: Dirk Marinus Van Aartrijk, Doorwerth (NL)

(73) Assignee: N.V. Kema, Arnhem (NL)

( * ) Notice: Subject to any disclaimer, the term of this patent is extended or adjusted under 35 U.S.C. 154(b) by 0 days.

(21) Appl. No.: 09/380,029
(22) PCT Filed: Feb. 24, 1998
(86) PCT No.: PCT/NL98/00111
  § 371 Date: Dec. 7, 1999
  § 102(e) Date: Dec. 7, 1999
(87) PCT Pub. No.: WO98/37427
  PCT Pub. Date: Aug. 27, 1998

(30) Foreign Application Priority Data

Feb. 24, 1997 (NL) .............................................. 1005349

(51) Int. Cl.[7] ........................ G01R 31/08; G01R 31/28; G01R 27/28
(52) U.S. Cl. ........................ 324/535; 324/528; 324/617
(58) Field of Search ................................. 324/528, 535, 324/617

(56) References Cited

U.S. PATENT DOCUMENTS

| | | | | |
|---|---|---|---|---|
| 5,070,537 A | * | 12/1991 | Ohira et al. ............. | 324/535 X |
| 5,508,619 A | * | 4/1996 | Ozawa et al. ............... | 324/535 |
| 5,682,100 A | * | 10/1997 | Rossi et al. ................. | 324/535 |
| 5,729,144 A | * | 3/1998 | Cummins .................... | 324/535 |
| 5,786,699 A | * | 7/1998 | Sukegawa et al. .......... | 324/617 |

* cited by examiner

Primary Examiner—Safet Metjahic
Assistant Examiner—Wasseem H. Hamdan
(74) Attorney, Agent, or Firm—Bell, Boyd & Lloyd LLC

(57) ABSTRACT

The invention relates to a method for detecting at least one irregularity in the dielectric around a substantially elongate conductor, comprising of: applying a potential difference between the conductor and the earth; measuring at a first position voltage changes caused by said irregularity and moving in the direction of the first position; measuring at a second position voltage changes caused by said irregularity and moving in the direction of the second position; determining with the use of time registration the difference in arrival time of voltage changes caused by the same irregularity and measured at the first and second position; determining the position of the irregularity in said conductor on the basis of the, difference in arrival time and the length of said conductor between the first and second position.

20 Claims, 4 Drawing Sheets

METHOD AND DEVICE FOR DETECTING AND LOCATING IRREGULARITIES IN A DIELECTRIC

The present invention relates to a method and device for detecting and locating irregularities in the dielectric around a conductor, wherein the conductor is substantially elongate. The irregularities in the dielectric around a conductor can cause so-called partial discharges. These can occur for instance in the dielectric material situated between a core and an earth sheath of a cable. The partial discharges can result in loss of quality of the cable. Partial discharges are moreover often the precursor of complete discharges, or breakdown, whereby the cable becomes defective.

Known from the international patent application WO 94/10579 is a method and device for detecting partial discharges occurring in a cable, in which the earth sheath of the cable has a helical structure, wherein on one side of the cable at least one detection coil is arranged around the cable for detecting electromagnetic voltage changes which displace along the cable. The voltage changes, which are generated by possible partial discharges and which are propagated in both directions of the conductor from the position of the partial discharge, are detected and analyzed. Use is made herein of so-called end reflections of the voltage changes on the outer ends of the cable. The detection coil will first detect the direct voltage change which is transmitted directly from the position of the partial discharge to the detection coil. The detection coil will then detect the indirect voltage changes which are transmitted from the position of partial discharge to the detection coil via a reflection against an end of the cable. On the basis of the measured time difference between detection of the direct voltage change caused by a partial discharge and detection of the indirect voltage change caused by a partial discharge and reflected against the end of the cable, and also on the basis of the fact that the propagation speed of the voltage change is known, the path length difference between the direct and indirect pulse can be determined. The position of the partial discharge can be determined in accurate manner from the computed path length difference and the already known total length of the cable.

This method does however have a number of significant drawbacks. Since the indirect voltage change often arrives at the detector in the "tail" of the direct voltage change and moreover the indirect voltage change often has a smaller amplitude than the direct voltage change, the indirect voltage change can often not be recognized, or only with great difficulty. One consequence of this is that analysis of the measurements cannot be automated and that the analysis must be performed by highly qualified and highly trained personnel. This, however, entails high cost.

A method is sought wherein these drawbacks can be reduced or obviated.

The object of the present invention is to provide a method and device with which, either in manual or automated manner, the positions of irregularities in conductors can be simply determined. This object is achieved in the manner described below.

Instead of detecting the direct and indirect voltage changes on one side of the conductor, as described above, according to the present invention measuring takes place on both sides of the conductor. Herein only the direct voltage changes arriving on both sides are analyzed. The indirect, i.e. Reflected, voltage changes arriving on both sides are not taken into consideration. However, in order to be able to determine the differences in arrival times of the voltage changes caused by one and the same irregularity on both sides of the cable, a very accurate time registration is required. By means of this time registration the measured signals can be provided with a so-called time label, with which the progression of the signal in time can be determined. The signal provided with a time label can be stored on a random medium or be transmitted via communication means to a central collection unit. On the basis of the time difference between the moment at which the direct voltage change arrives on the one side and the moment at which the direct voltage change arrives on the other side and on the basis of the fact that the propagation speed of the voltage change is known, the path length difference, i.e. the difference in the distance covered by the two voltage changes, can be determined. On the basis of this determined path length difference and the already known total length of the cable, the location or position of said irregularities can be determined.

According to a preferred embodiment of the present invention, time registration is performed by coupling time and position data received via a plurality of satellites to the measured voltage changes. The time data received per determined detection position and transmitted via satellites are herein corrected for the exact detection position which follows from the data transmitted via the satellite. This correction is necessary in order to obtain the required accuracy in time, since the voltage changes displace practically at the speed of light and the difference in arrival time of the voltage changes is thereby very small (in the order of magnitude of ½ to many tens of microseconds).

According to another preferred embodiment of the present invention, time registration is carried out by means of very accurate clocks, for instance crystal clocks, which must be calibrated prior to the measurements. These clocks supply the time registration which is required at each detector in order to provide the detected voltage changes with a correct time label.

According to yet another embodiment of the present invention, branched cables can be used instead of single cables. A plurality of (preferably all) branches of the cable are herein provided with voltage detection means. The positions of the irregularities can be determined in a manner wholly analogous to that described above.

The present invention can be elucidated with reference to the annexed figures.

FIG. 1 shows a schematic view of the measurement configuration wherein the method of the present invention is used.

FIGS. 2a and 2b shows the voltage progression measured by the two detectors 6 and 7 before synchronization of the voltage progression using the measured time labels.

FIGS. 3a end 3b show 4 the voltage progression measured by the two detectors 6 and 7 after synchronization using the time labels.

Figure 1:
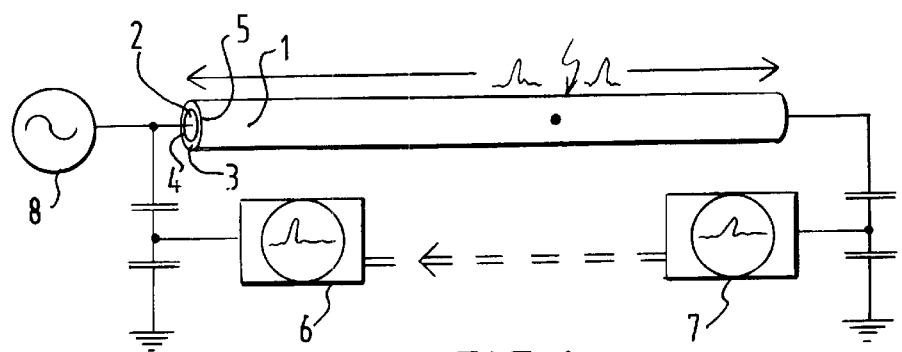

The method according to the present invention is used to test for irregularities in the dielectric of conductors with earth shields or cables. Shown by way of example in FIG. 1 is a high-voltage cable 1, the length of which can vary from 10 m to 10 km and the voltage from 1 kV to 400 kV. The high-voltage cable is formed from a core 2 and an earth sheath 3 with a dielectric material 4 therebetween. Protective jacket 5 is arranged round earth sheath 3. The measurements according to the invention are performed by detecting means 6 and 7, which consist for instance of capacitive dividers (high-ohmic for the power supply, low-ohmic for the discharge signals) and oscilloscopes. As can be seen in FIG. 1, the cable is connected to a high-voltage source 8. The frequency of the signal generated by the voltage source is 0.1–200 Hertz. The voltage source can be formed by the original power supply or by a separate supply. By increasing the voltage in the cable the voltage can be found at which partial discharges occur just above the detection threshold. The voltage may not be increased too much (for instance no more than twice the operating voltage), so that the cable is not too heavily loaded, whereby the risk of damage to the cable increases.

Figure 2A:
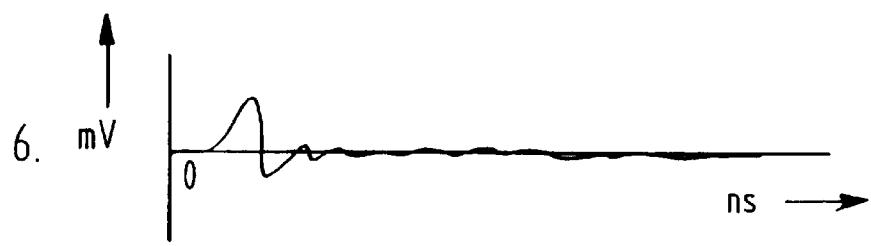
Figure 2B:
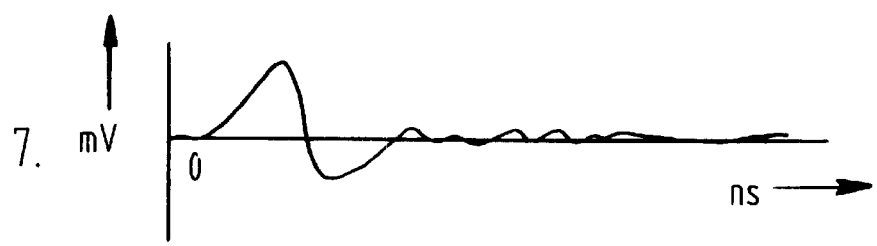

FIG. 2 shows a characteristic voltage progression in time of the oscilloscopes before time synchronization has taken place. The direct pulses caused by one and the same partial discharge are also shown in the figure. The amplitude of the pulses is in the order of several mV to several hundred mV and the time duration amounts to about 1000 ns.

Figure 3A:
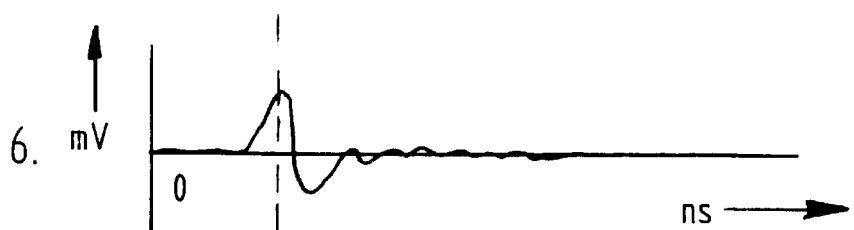
Figure 3B:
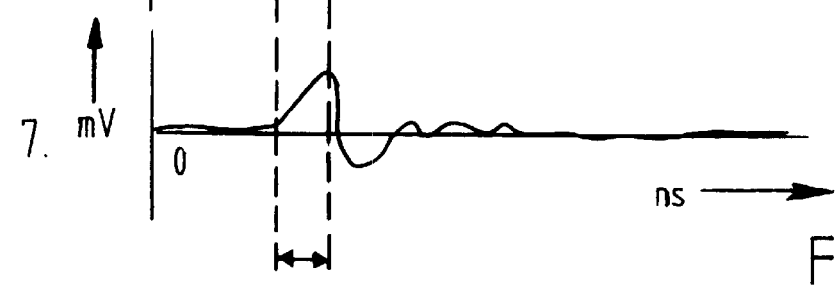

FIG. 3 shows the voltage progressions of oscilloscopes after time synchronization. Time synchronization entails in this case that the time axis of the voltage progression in oscilloscope 6 and that of oscilloscope 7 are the same. From the figure can be determined the time difference ΔT between the arrival of a voltage change and a corresponding voltage change at B. From the time difference ΔT, the propagation speed of the voltage change in the cable and the already known length of the cable, the position of the above stated irregularity, in this case partial discharge, can be determined with an accuracy of 1–30 m.

Figure 4:
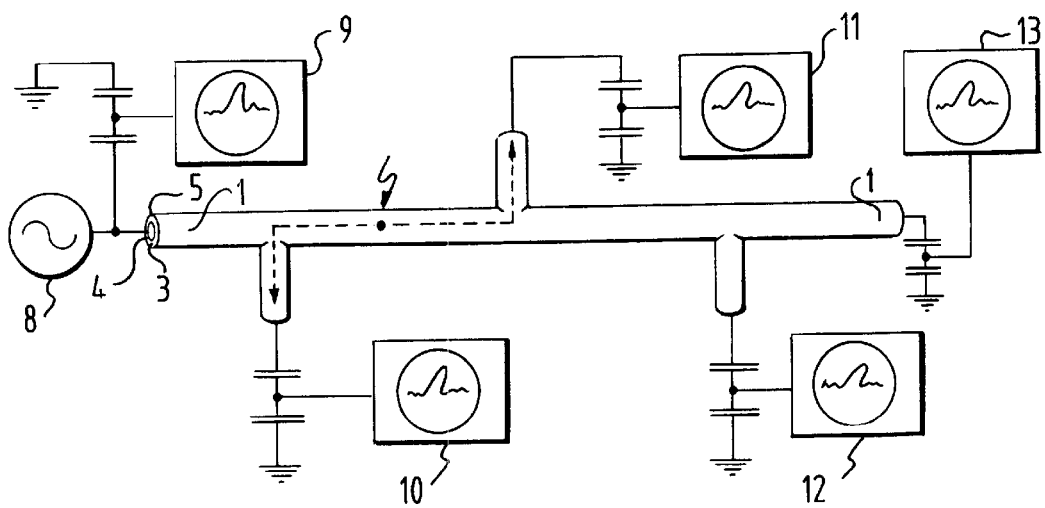
FIG. 4 shows a schematic view of the measurement configuration in a branched cable, i.e.a configuration with more than two detection means.

FIG. 4 shows the situation in the case of a branched cable. In this example the cable has three branches, although this can be any random number. Placed at the end of each branch is a detection means (this is however not required for all branches).

Figure 5:
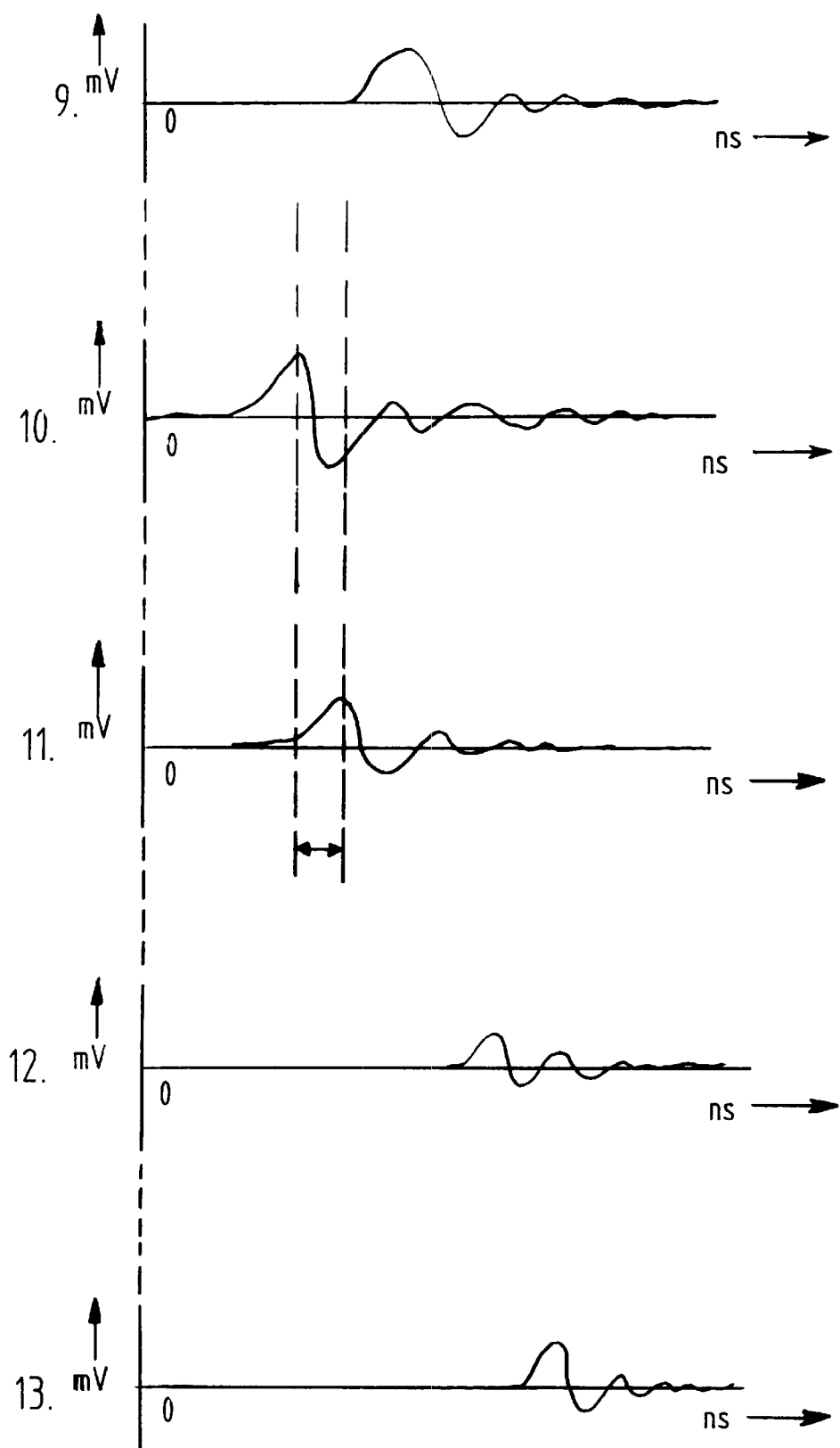
FIG. 5 shows the voltage progression measured by the detectors 9 to 13 after synchronization using the time labels.

In FIG. 5 are shown characteristic voltage progressions in time of the five oscilloscopes 9–13. Oscilloscopes 10 and 11 receive the voltage changes caused by a partial discharge before the other oscilloscopes 9, 12 and 13. The partial discharge has therefore taken place in the zone of the cable between oscilloscope 10 and oscilloscope 11. The position of the irregularity can be determined on the basis of a correct time labelling, possible correction for the position of the oscilloscopes and the lengths of the (branches) of the cable 1 known beforehand.

Figure 6:
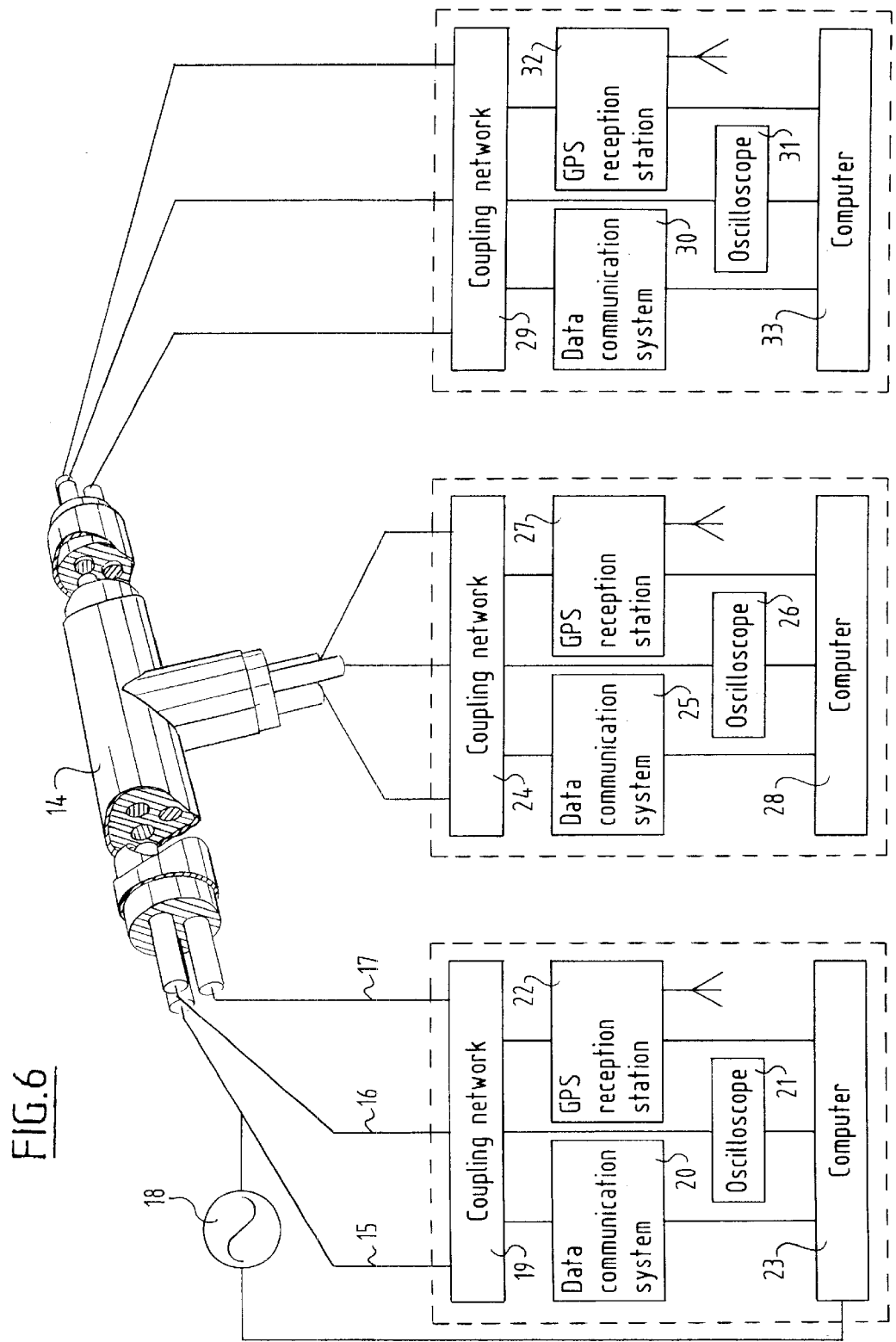
FIG. 6 shows a further embodiment of the present invention.

FIG. 6 shows a further embodiment of the method according to the present invention. A cable 14 for testing contains three cable cores 15, 16 and 17. Cable core 15 is connected to a high-voltage generator 18 which generates a voltage with a voltage level preferably between 1 kv and 41 kV and a frequency preferably between 0.1 and 200 Hertz. At one end of cable 14 the cable cores 15, 16 and 17 are connected to a coupling network 19, at another end of cable 14 the cable cores 15, 16 and 17 are connected to coupling network 29 and at the end of a branch of cable 14 the cable cores are connected to coupling network 24. On coupling network 19 are arranged respectively a data communication system 20, an oscilloscope or digitizer 21 and a GPS reception station 22. Likewise arranged on coupling networks 24 and 29 are respectively data communication systems 25 and 30, oscilloscopes or digitizers 26 and 31 and GPS reception stations 27 and 32. High-voltage generator 18, data communication system 20, oscilloscope 21 and GPS reception station 22 are connected to a computer 23 for control thereof. Computers 28 and 33 are provided for control of the corresponding systems on the other ends of cable 14.

The method for measuring the partial discharge, which is based on triggering of the oscilloscope or digitizer on the arrival of a discharge pulse, preferably comprises of:

installing and activating the GPS reception stations 22, 27 and 32;

activating high-voltage generator 18, wherein voltage is applied to any of the three cable cores 15, 16 and 17;

adjusting the measuring systems, including oscilloscopes 21, 26 and 31, wherein use is made of data communication systems 20, 25 and 30. Data communication preferably takes place via the other two unused cable cores 16 and 17 or via transmitter-receivers (not shown) provided at the measurement positions;

measuring the voltage pulses caused by the partial discharges which are released from cable core 15 during a test. These voltage pulses generally have a maximum voltage amplitude of between 20 mV and 500 mV and a broad frequency spectrum which depends on the length of the cable and the position of the discharge and which generally extends from 100 Hz to 10 MHz. The voltage pulses caused by a partial discharge arrive at different points in time at the deployed measuring systems, wherein via coupling networks 19, 24 and 29 the voltage pulses are measured by oscilloscopes 22, 27, 32 and the voltage pulses are preferably stored on computers 23, 28, 33;

registering and storing in computers 23, 28, 33 the arrival times of the partial discharges, preferably in the form of the Universal Time Coordinates labels supplied by the GPS reception stations. Universal Time Coordinates contain inter alia information about the degree of longitude and latitude, altitude and absolute time.

The partial discharges in the other two cable cores 16 and 17 can subsequently be measured. The accuracy of the above described determination of the discharge position is dependent on the length of the cable 14 for measuring, the number of measuring systems which can be employed, the noise level, the discharge magnitude and the composition of cable 14, i.e. the structure of the cable. The cable can be assembled from different types of cable with different transmission properties. An accuracy of 8 to 25 m can generally be obtained.

An alternative preferred embodiment for performing the method of the invention consists of simultaneously carrying out one or more registrations. Simultaneously is understood to mean that all digitizers or oscilloscopes perform a registration from exactly the same moment. For a pre-determined time period (for instance 0.5 or 2 seconds) measurement data is stored in computers 23, 28 and 33. Performing a registration at exactly the same moment is made possible by reading out the degree of longitude and latitude, altitude and absolute time of GPS reception stations 22, 27, 32 and by control using computers 23, 28 and 33.

What is claimed is:

1. A method for determining the position of at least one irregularity in the dielectric around a substantially elongate conductor of known length, comprising the steps of:

applying a potential difference between the conductor and the earth;

measuring at a first position of the conductor first voltage changes caused by said at least one irregularity, wherein said first voltage changes move in the direction of the first position;

measuring at a second position of the conductor second voltage changes caused by said at least one irregularity, wherein said second voltage changes move in the direction of the second position;

determining the difference in arrival times of the first and second voltage changes caused by the same at least one irregularity and measured at the first and second position; and determining the position of the at least one irregularity in said conductor based on the difference in arrival times and the length of said conductor between the first and second position;

wherein the step of determining the difference in arrival times comprises the steps of:
  determining the arrival times of said first voltage changes; and
  determining the arrival times of said second voltage changes; and
  wherein the at least one irregularity results in partial discharges.

2. The method of claim 1, wherein arrival times are determined by providing the measured voltage changes with time labels.

3. The method of claim 1, wherein determining of the arrival times of said voltage changes is effected by time data received via at least one satellite.

4. The method of claim 3, wherein determining of the arrival time of voltage changes takes place by correcting the time data received via at least one satellite on the basis of position data obtained via said at least one satellite.

5. The method of claim 1, wherein determining of the arrival times of said voltage changes is effected by pre-calibrated, accurate time clocks, wherein a time clock is provided at each detection position.

6. The method of claim 1, wherein the substantially elongate conductor is a cable.

7. The method of claim 6, wherein the cable contains at least a core and earth sheath.

8. The method of claim 1, wherein the substantially elongate conductor has one or more branches.

9. The method of claim 1, wherein the voltage changes are detected at more than two positions.

10. The method of claim 1, wherein said voltage changes are formed by short-lived pulse signals.

11. The method of claim 1, wherein the measured voltage changes and determining of the arrival times are recorded on a medium.

12. The method of claim 1, wherein the measured voltage changes and determining of the arrival times are collected centrally via transmission.

13. The method of claim 1, wherein the measured voltage changes and determining of the arrival times are transmitted wireless.

14. A device for determining the position of at least one irregularity between a first and second position in the dielectric around a substantially elongate conductor with earth, comprising:
  a supply voltage source for applying a potential difference between the conductor and the earth;
  first voltage detection means for detecting first voltage changes at the first position;
  second voltage detection means for detecting second voltage changes at the second position;
  difference determining means for determining the difference in arrival time between two voltage changes caused by the same random at least one irregularity;
  position computing means for computing the position of the at least one irregularity in said conductor,
  characterized by time registration means for determining points in time at which a voltage change is detected by the first and second voltage detection means; and
  wherein the at least one irregularity results in partial discharges.

15. The device of claim 14, wherein the time registration means contain computing means for correction of time data obtained via satellites on the basis of position data obtained via satellites.

16. The device of claim 14, wherein the voltage detection means comprise oscilloscopes.

17. The device of claim 14, wherein the time registration means comprise satellites.

18. The device of claim 14, wherein the time registration means comprise crystal clocks.

19. The device of claim 14, wherein the voltage detection means comprise digitizers.

20. The device of claim 14, wherein the time registration means comprise GPS reception stations.

* * * * *